United States Patent
Ishigaki et al.

(10) Patent No.: US 9,599,233 B2
(45) Date of Patent: Mar. 21, 2017

(54) GATE VALVE

(71) Applicant: SMC CORPORATION, Chiyoda-ku (JP)

(72) Inventors: Tsuneo Ishigaki, Kitakatsushika-gun (JP); Hiromi Shimoda, Noda (JP); Takashi Nagao, Abiko (JP)

(73) Assignee: SMC CORPORATION, Chiyoda-ku (JP)

( * ) Notice: Subject to any disclaimer, the term of this patent is extended or adjusted under 35 U.S.C. 154(b) by 0 days.

(21) Appl. No.: 14/679,227

(22) Filed: Apr. 6, 2015

(65) Prior Publication Data

US 2015/0316155 A1 Nov. 5, 2015

(30) Foreign Application Priority Data

Apr. 30, 2014 (JP) ................................. 2014-093750

(51) Int. Cl.

| F16K 3/02 | (2006.01) |
|---|---|
| F16K 3/18 | (2006.01) |
| F16K 27/04 | (2006.01) |
| F16K 51/02 | (2006.01) |
| H01L 21/67 | (2006.01) |

(52) U.S. Cl.
CPC .......... *F16K 3/0218* (2013.01); *F16K 3/0281* (2013.01); *F16K 3/184* (2013.01); *F16K 27/044* (2013.01); *F16K 51/02* (2013.01); *H01L 21/67126* (2013.01)

(58) Field of Classification Search
CPC ...... F16K 3/0218; F16K 3/184; F16K 3/0281; F16K 27/044; F16K 51/02; H01L 21/67126

USPC ................ 251/282, 326, 293, 203
See application file for complete search history.

(56) References Cited

U.S. PATENT DOCUMENTS

| 2,660,397 | A | 11/1953 | Volpin |
| 2,971,527 | A | 2/1961 | Eichenberg et al. |
| 2004/0007188 | A1 | 1/2004 | Burkhart et al. |
| 2014/0003892 | A1 | 1/2014 | Yamamoto et al. |

FOREIGN PATENT DOCUMENTS

| JP | 11-351419 | 12/1999 | | |
| JP | WO 2012128029 A1 * | 9/2012 | ............ | F16K 51/02 |

OTHER PUBLICATIONS

German Office Action issued Jul. 13, 2015 in Patent Application No. 10 2015 105 899.5 (without English Translation).

* cited by examiner

*Primary Examiner* — Marina Tietjen
(74) *Attorney, Agent, or Firm* — Oblon, McClelland, Maier & Neustadt, L.L.P.

(57) ABSTRACT

In a valve box that makes up a gate valve, a balance room is disposed on one side wall that faces toward a processing chamber. In the balance room, a first seal member is provided to surround a first pathway, and a second seal member is mounted on an outer edge of the balance room. Further, a balance port is formed in the balance room. The balance port communicates with an accommodating room that is formed in the interior of the valve box. In a valve closed state in which a valve disk is seated on a valve seat of the valve box, the pressure inside the accommodating room and the pressure inside the balance room are equalized or made uniform through the balance port.

4 Claims, 8 Drawing Sheets

GATE VALVE

CROSS-REFERENCE TO RELATED APPLICATION

This application is based upon and claims the benefit of priority from Japanese Patent Application No. 2014-093750 filed on Apr. 30, 2014, the contents of which are incorporated herein by reference.

BACKGROUND OF THE INVENTION

Field of the Invention

The present invention relates to a gate valve, which is mounted in a vacuum chamber in a semiconductor processing apparatus, and is provided for opening/closing of an opening that communicates with the vacuum chamber.

Description of the Related Art

Heretofore, in a processing apparatus for semiconductor wafers or liquid crystal substrates or the like, withdrawal and introduction of the semiconductor wafers or liquid crystal substrates, etc. are carried out, into and out of various processing chambers through pathways. In the respective pathways, gate valves have been used for carrying out opening and closing the pathways.

For example, as disclosed in Japanese Laid-Open Patent Publication No. 11-351419, such a gate valve is provided so that a valve disk is made to arrive at a facing position to a valve seat in a valve box, by linear movement of a valve rod, which is displaced under a driving action of a cylinder. Thereafter, by moving the valve disk horizontally such that a seal member thereof presses against a valve seat, the pathway formed in the valve box is closed.

SUMMARY OF THE INVENTION

In the aforementioned gate valve, a case is known in which, for example, in a valve closed state in which the valve disk is seated on the valve seat, one processing chamber, which is connected to one end side of the valve box, is kept at atmospheric pressure, whereas another processing chamber, which is connected to another end side of the valve box, is held under a vacuum. In this case, since the one processing chamber and the interior of the valve box are separated by the valve disk, whereas the other processing chamber and the interior of the valve box communicate and are held at vacuum pressure, due to the pressure difference that occurs between the inside of the valve box and the outside of the valve box, the walls of the valve box are pressed inwardly and tend to undergo deformation.

In particular, if the wall portion on which the valve seat is provided for seating of the valve disk undergoes deformation, the sealing ability of the seal member on the valve disk becomes deteriorated. For this reason, in order to suppress deformation of the valve box due to a pressure difference, although it may be considered to form the walls of the valve box with a certain thickness beforehand. In this case, however, the weight of the valve box increases, and the overall weight of the gate valve as a whole also is increased detrimentally.

A general object of the present invention is to provide a gate valve, which can prevent deformation of a valve box while also avoiding an increase in weight, and can reliably and stably carry out sealing when the gate valve is closed.

The present invention is characterized by a gate valve equipped with a valve box, a valve disk configured to be seated with respect to a valve seat formed in the valve box, a valve rod connected to the valve disk and configured to cause the valve disk to undergo linear movement as well as movements to approach and separate away from the valve seat, and a drive unit disposed in interior of a housing to which the valve box is connected, the drive unit linearly displacing the valve rod along an axial direction.

In the gate valve, the valve box includes:

an accommodating room in which the valve disk is accommodated;

a wall portion that constitutes part of the accommodating room, and having a valve seat on which the valve disk is seated;

a pathway formed in the wall portion and which provides communication between the accommodating room and a processing chamber adjacent to the valve box;

a balance room formed in the wall portion in facing relation to the processing chamber; and a communication port, which provides communication between the balance room and the accommodating room, and is disposed out of communication with the pathway in interior of the balance room.

According to the present invention, in the valve box that makes up the gate valve, some elements are provided, such as the accommodating room in which the valve disk is accommodated, the wall portion having a valve seat on which the valve disk is seated, the pathway formed in the wall portion and which provides communication between the accommodating room and a processing chamber adjacent to the valve box, the balance room formed in facing relation to the processing chamber, and the communication port, which provides communication between the balance room and the accommodating room, and is disposed out of communication with the pathway in the interior of the balance room.

Consequently, for example, in a valve closed state in which the valve disk is seated on the valve seat, even if a pressure difference is generated between the accommodating room and the processing chamber adjacent to the accommodating room, the pressures of the accommodating room and the balance room are equalized or set at the same pressure through the communication port, whereby loads due to pressure differences, which are imposed with respect to the wall portion provided between the accommodating room and the processing chamber, are avoided. As a result, without increasing the weight of the valve box, deformation of the wall portion of the valve box due to pressure differences can reliably be prevented. Further, by preventing deformation of the valve seat provided in the wall portion, sealing of the valve disk can reliably and stably be carried out with respect to the valve seat when the gate valve is closed.

The above and other objects, features and advantages of the present invention will become more apparent from the following description when taken in conjunction with the accompanying drawings, in which a preferred embodiment of the present invention is shown by way of illustrative example.

DESCRIPTION OF THE PREFERRED EMBODIMENTS

Figure 1:
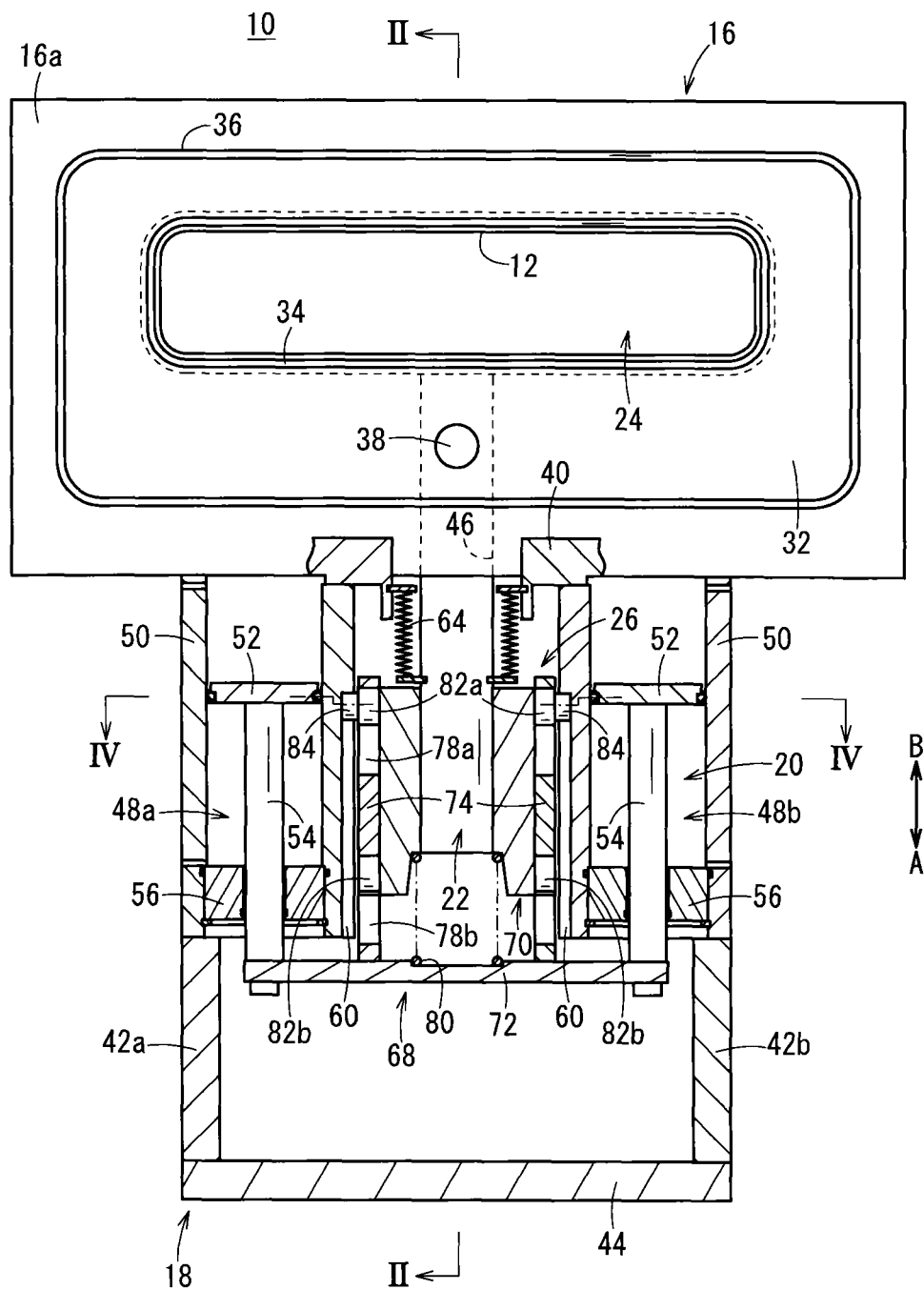
FIG. 1 is a front view, shown partially in cross section, of a gate valve according to an embodiment of the present invention.
Figure 2:
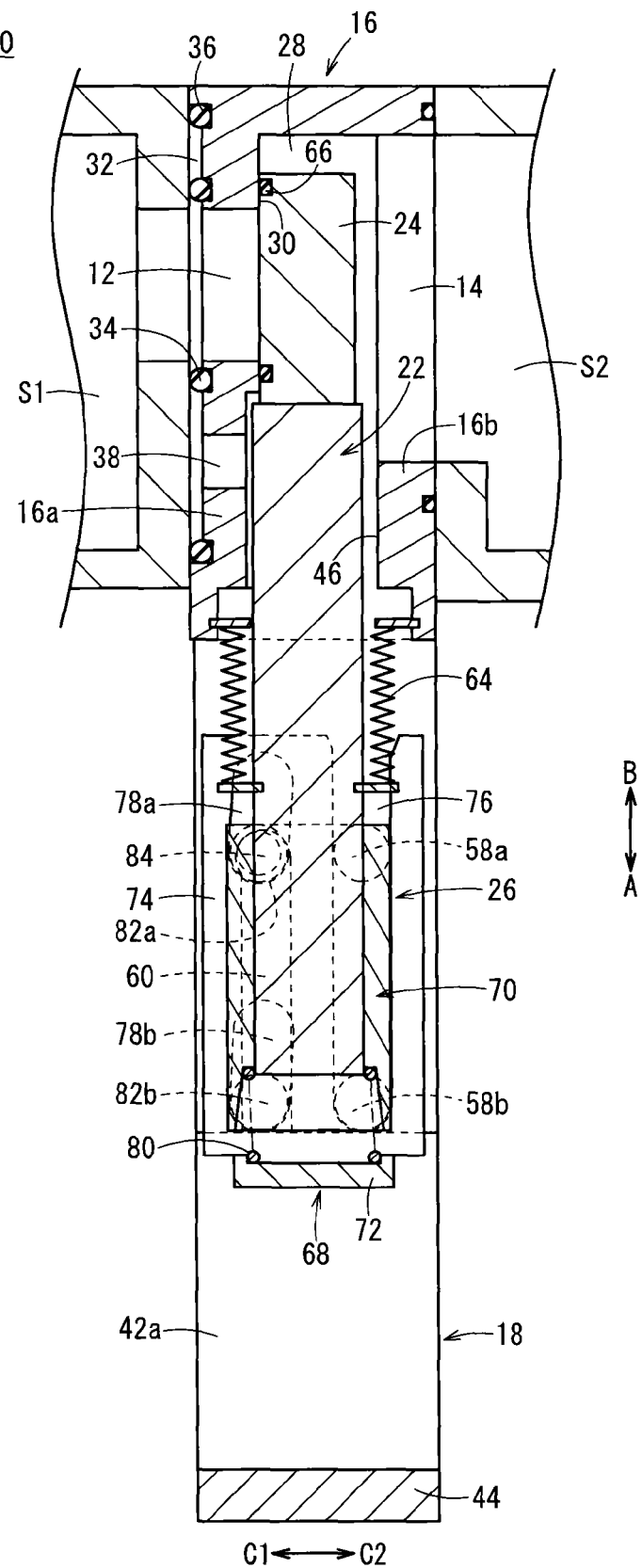
FIG. 2 is a cross-sectional view taken along line II-II of FIG. 1.

As shown in FIGS. 1 and 2, a gate valve 10 includes a valve box 16 in which first and second pathways 12, 14 are formed (see FIG. 2) for allowing a non-illustrated workpiece (e.g., a semiconductor wafer) to be inserted and taken out, a housing 18 connected to a lower portion of the valve box 16, a cylinder section 20 that functions as a drive unit and is disposed in the interior of the housing 18, a valve rod 22 that is displaced along an axial direction (the directions of arrows A and B) under a driving action of the cylinder section 20, as well as moving substantially perpendicularly with respect to the axial direction, a valve disk 24 connected to one end of the valve rod 22 and which is capable of closing the first pathway 12 of the valve box 16, and a drive conversion unit 26 that converts linear displacement of the cylinder section 20 into movement in a direction perpendicular to the axis of the valve rod 22.

Figure 3:
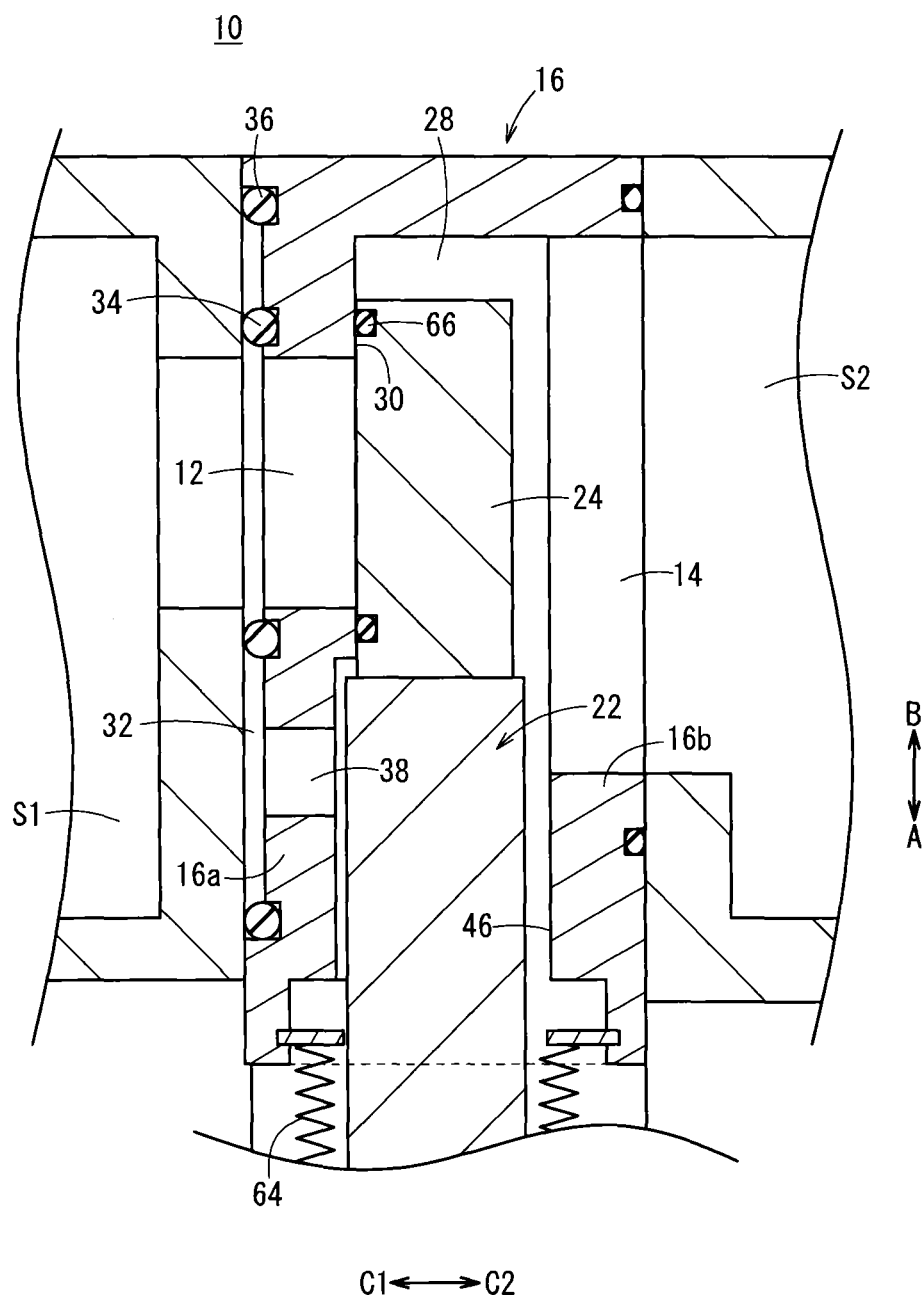
FIG. 3 is an enlarged cross-sectional view showing the vicinity of a valve disk of FIG. 2.

As shown in FIGS. 2 and 3, the valve box 16, for example, is formed in a hollow box-like shape, and includes an accommodating room 28 provided in the interior thereof in which the valve disk 24 is capable of moving. On one side wall (wall portion) 16a and another side wall 16b of the valve box 16 that faces toward the accommodating room 28, the first and second pathways 12, 14 are formed, which open respectively with rectangular shapes in cross section.

In the valve box 16, on an inner wall surface of the one side wall 16a, a valve seat 30 is formed that faces toward the first pathway 12. The valve seat 30 is disposed so that the valve disk 24 can abut thereon. The one side wall 16a and the other side wall 16b in the valve box 16 are formed substantially in parallel sandwiching the accommodating room 28 therebetween (see FIG. 2).

Further, in the valve box 16, a processing chamber S1 is connected on the side of the one side wall 16a and communicates through the first pathway 12, while another processing chamber S2 is connected on the side of the other side wall 16b and communicates through the second pathway 14.

Furthermore, as shown in FIGS. 1 through 3, a balance room 32, which is recessed at a predetermined depth on an outer wall surface facing toward the processing chamber S1, is formed on the one side wall 16a of the valve box 16. The balance room 32 is formed inwardly at a predetermined width with respect to an outer edge of the one side wall 16a, and the first pathway 12 opens in a central portion thereof. More specifically, the balance room 32 is formed in an annular shape having the first pathway 12 in a central region thereof.

Further, the balance room 32 comprises a first seal member (seal member) 34, which is disposed to cover an outer side of the first pathway 12, and a second seal member 36, which is disposed on the outer edge of the balance room 32.

The first and second seal members 34, 36, for example, are formed in substantially rectangular ring-like shapes from a resilient material such as rubber or the like, and are mounted in respective annular grooves formed in the wall surface of the balance room 32. In a state in which they are mounted respectively in the annular grooves, the first and second seal members 34, 36 are disposed so as to project from the outer wall surface at a predetermined height toward the side of the processing chamber S1 (see FIG. 3).

Stated otherwise, the balance room 32 is formed in an annular shape, in which the second seal member 36 is disposed so as to surround an outer side of the first seal member 34, which is disposed on the inside.

The present invention is not limited to a case in which the second seal member 36 is disposed on an outer circumferential side of the first seal member 34 and the balance room 32 is formed between the first seal member 34 and the second seal member 36. For example, the balance room 32 may be arranged downwardly from the first seal member 34 so as to enclose a balance port 38, to be described below.

Furthermore, the balance port (communication port) 38 is formed in the balance room 32 at a position between the first seal member 34 and the second seal member 36. The balance port 38, for example, is substantially circular in cross section, and penetrates in a straight line from the balance room 32 to the accommodating room 28. More specifically, the balance port 38 is formed substantially in parallel with the first pathway 12 while being separated a predetermined distance therefrom, and is formed with a smaller cross-sectional size than the first pathway 12.

As shown in FIGS. 1 and 2, the housing 18 is made up from a base frame 40 that is connected to a lower portion of the valve box 16, a pair of side frames 42a, 42b connected respectively to both ends of the base frame 40 and sandwiching the cylinder section 20 therebetween, and a cover frame 44 that joins or interconnects each of the lower ends of the side frames 42a, 42b.

The base frame 40 is disposed so as to cover the lower portion of the valve box 16. The accommodating room 28 of the valve box 16 and the interior of the housing 18 communicate with each other through a rod hole 46 that is formed substantially in the center of the base frame 40. A later-described valve rod 22 is inserted displaceably through the rod hole 46.

The side frames 42a, 42b are formed substantially perpendicularly with respect to the base frame 40. The base frame 40 is connected to upper portions of the side frames 42a, 42b, and cylinder tubes 50 that constitute the cylinder section 20 are fixed to both of the side frames 42a, 42b, respectively, in a substantially parallel condition.

As shown in FIG. 1, the cylinder section 20 is constituted from a pair of fluid pressure cylinders 48a, 48b, which are disposed on both ends along a longitudinal direction of the base frame 40. Each of the fluid pressure cylinders 48a, 48b includes, respectively, the hollow cylindrical cylinder tube 50, a piston 52 disposed for displacement along an axial direction (the directions of arrows A and B) in the interior of the cylinder tube 50, and a piston rod 54 connected to the piston 52.

Ends of the cylinder tubes 50 are closed by connection to the base frame 40, whereas the other ends thereof are closed by rod covers 56 through which the piston rods 54 can be inserted. Consequently, by a pressure fluid, which is supplied from a non-illustrated port to the interiors of the cylinder tubes 50, the pistons 52 are pressed in an axial direction (the directions of arrows A and B), thereby displacing the piston rods 54.

Figure 4:
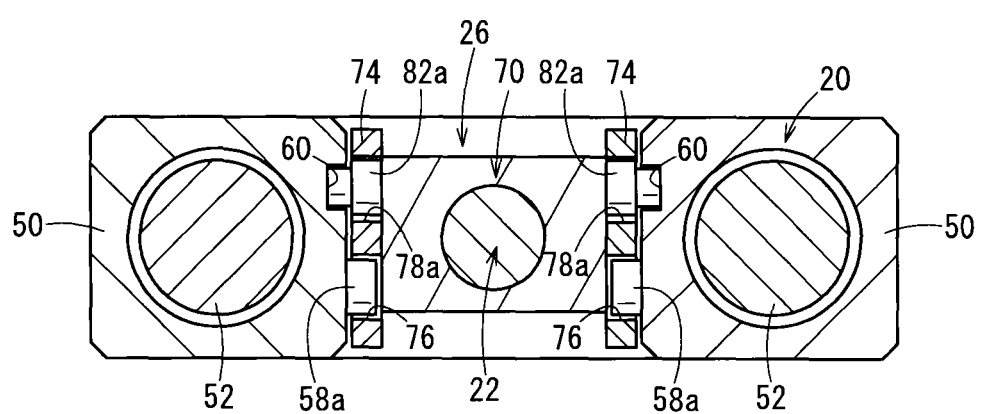
FIG. 4 is a cross-sectional view taken along line IV-IV of FIG. 1.
Figure 5:
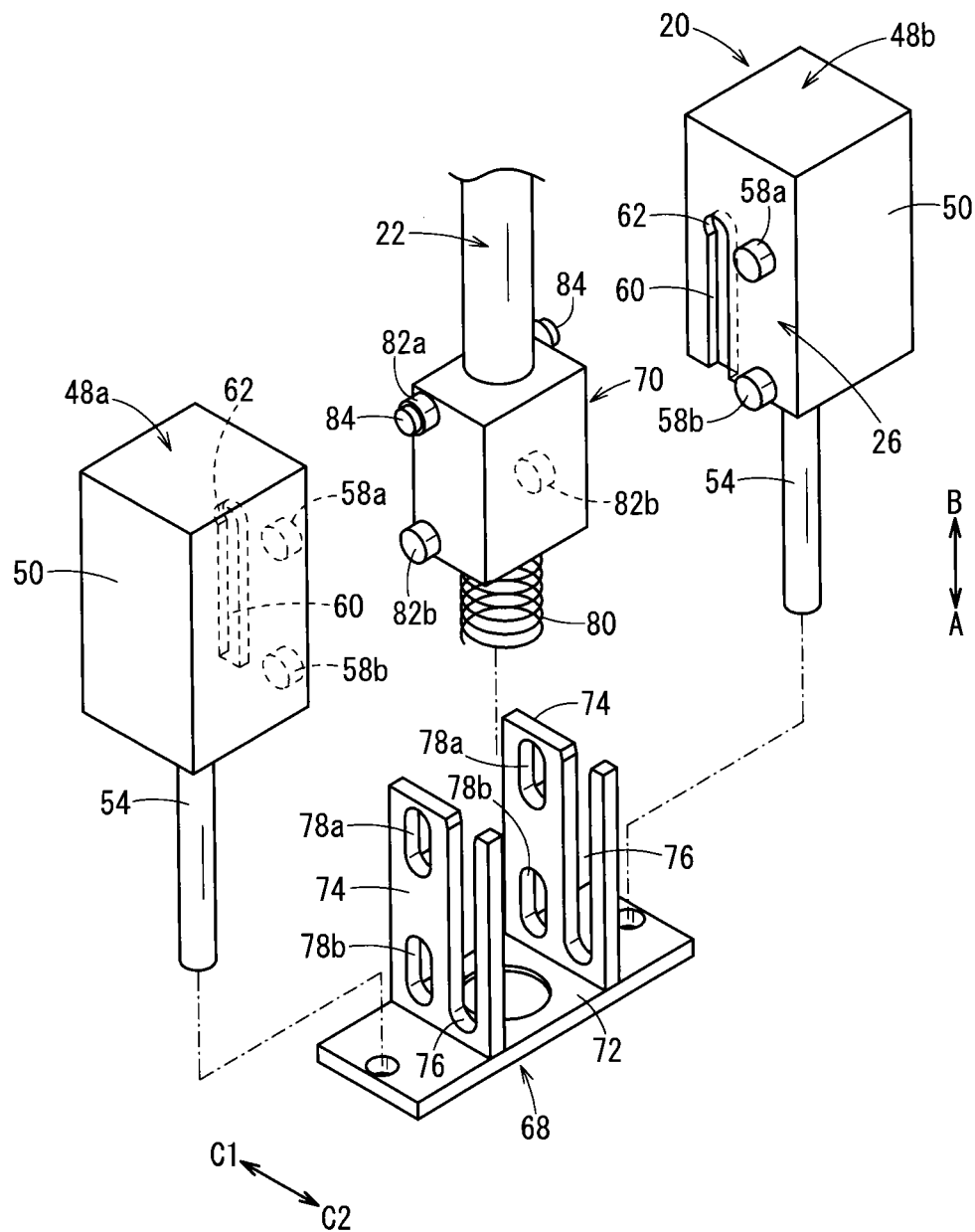
FIG. 5 is an exploded perspective view of a drive conversion unit in the gate valve of FIG. 1.

Further, as shown in FIGS. 2, 4, and 5, on side surfaces of each of the cylinder tubes 50 on a central side of the gate valve 10, pairs of guide rollers 58a, 58b are disposed rotatably. Together with the guide rollers 58a, 58b, recessed grooves 60 are formed substantially in parallel and separated by a predetermined distance from the guide rollers 58a, 58b.

The guide rollers 58a, 58b are separated a predetermined distance along the axial direction (the directions of arrows A and B) of the cylinder tubes 50, and are arranged on a straight line.

On the other hand, as shown in FIGS. 2 and 5, horizontal groove portions 62 are formed on respective upper ends of the recessed grooves 60. The horizontal groove portions 62 extend toward the side of the valve seat 30 of the valve box 16, in directions substantially perpendicular to the directions in which the recessed grooves 60 extend. Stopper rollers 84, which constitute the drive conversion unit 26, are inserted into the recessed grooves 60.

Upper ends of the piston rods 54 are connected to central portions of the pistons 52, whereas the lower ends thereof project outwardly from the cylinder tubes 50 and are connected respectively to a later-described yoke 68.

The valve rod 22 is disposed substantially in the center of the housing 18, and is inserted through the rod hole 46 of the base frame 40. A substantially central portion of the valve rod 22 along the axial direction thereof is covered by a bellows 64. The bellows 64 is made up from a bellows-shaped cylindrical body, such that when the valve rod 22 is displaced in the axial direction (the directions of arrows A and B), the bellows 64 expands and contracts while covering the valve rod 22, so that the portion of the valve rod 22 is covered at all times. Further, the upper end of the valve rod 22 is inserted into the interior of the valve box 16 and is connected to the valve disk 24.

The valve disk 24 is constituted from a plate having a rectangular shape in cross section corresponding to the opening of the first pathway 12 in the valve box 16. The valve rod 22 is connected to a substantially central portion of the valve disk 24, and a sealing ring 66 (see FIGS. 2 and 3) is mounted through an annular groove in a side surface of the valve disk 24 facing toward the valve seat 30. In addition, in a valve close state in which the valve disk 24 is seated on the valve seat 30, the sealing ring 66 abuts against the valve seat 30 to thereby block the communicating condition of the first pathway 12.

As shown in FIGS. 1 through 5, the drive conversion unit 26 includes the yoke 68 that is fixed to the other ends of the piston rods 54, and a displacement block 70 that is displaced integrally with the yoke 68.

The yoke 68, for example, is made up from a base section 72 disposed perpendicularly to the axes of the piston rods 54, and two cam frames 74, which are erected in an upstanding manner perpendicularly with respect to the base section 72. The piston rods 54 of the pair of fluid pressure cylinders 48a, 48b are connected respectively to opposite ends of the base section 72. Consequently, the yoke 68 is displaced integrally when the piston rods 54 are displaced together with the pistons 52 under the supply of a pressure fluid to the cylinder tubes 50.

As shown in FIGS. 4 and 5, each of the cam frames 74 includes a guide groove 76 extending in a longitudinal direction, and a pair of cam grooves 78a, 78b formed substantially in parallel with the guide groove 76, and which are separated mutually by a predetermined distance along the longitudinal direction. The cam grooves 78a, 78b are inclined such that upper portions thereof are oriented in directions away from the valve seat 30.

The valve rod 22 is inserted and connected integrally to a substantially central portion of the displacement block 70. A spring 80 constituted from a coil spring, for example, is interposed between the yoke 68 and the lower end of the displacement block 70. An elastic force of the spring 80 urges the yoke 68 and the displacement block 70 in directions (the direction of the arrow A, the direction of the arrow B) so as to separate mutually away from each other.

Further, two pairs of cam rollers 82a, 82b are disposed and supported rotatably while projecting outwardly from opposite side surfaces of the displacement block 70. In addition, the cam rollers 82a, 82b are inserted respectively into the cam grooves 78a, 78b of the yoke 68. Together therewith, the stopper rollers 84, which are disposed coaxially with the cam rollers 82a that are more distanced from the base section 72, are inserted through the cam grooves 78a and into the recessed grooves 60 of the cylinder tubes 50. The stopper rollers 84 are formed with a diameter that is smaller than that of the cam rollers 82a.

Moreover, when the displacement block 70 is raised together with the yoke 68 by driving the cylinder section 20, the yoke 68 is moved in a vertical direction (the direction of the arrow B) under a guiding action performed by the guide rollers 58a, 58b of the cylinder tubes 50, which are inserted into the guide grooves 76. Additionally, the stopper rollers 84 move into the horizontal groove portions 62 on the upper ends of the recessed grooves 60, whereupon the stopper rollers 84 move horizontally. As a result, through action of the displacement block 70, the valve rod 22 and the valve disk 24 are moved horizontally toward the side of the valve seat 30 (in the direction of the arrow C1 in FIGS. 2 and 3).

Figure 6:
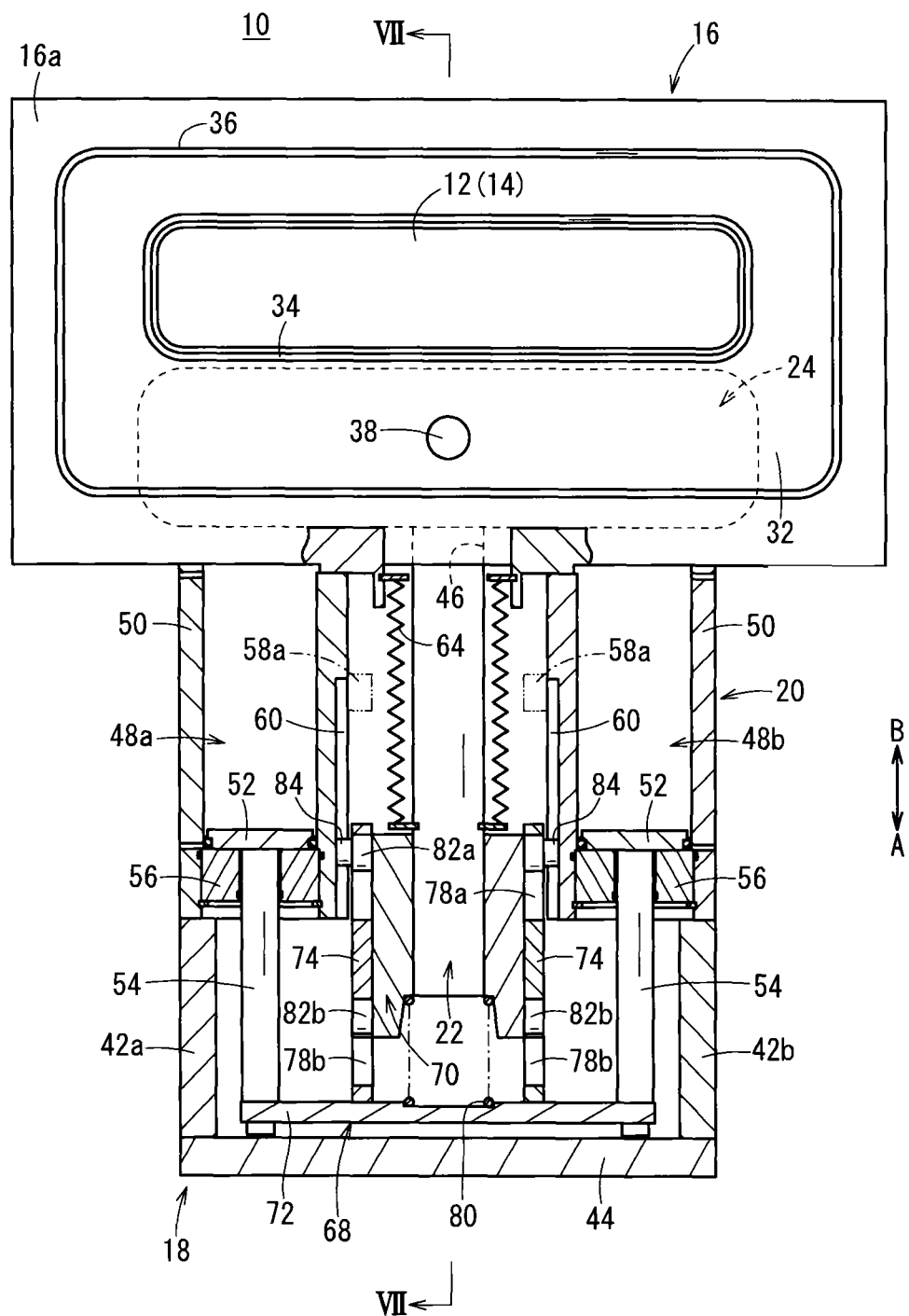
FIG. 6 is a front view, shown partially in cross section, and illustrating a valve open state in which a valve disk is moved in the gate valve of FIG. 1.
Figure 7:
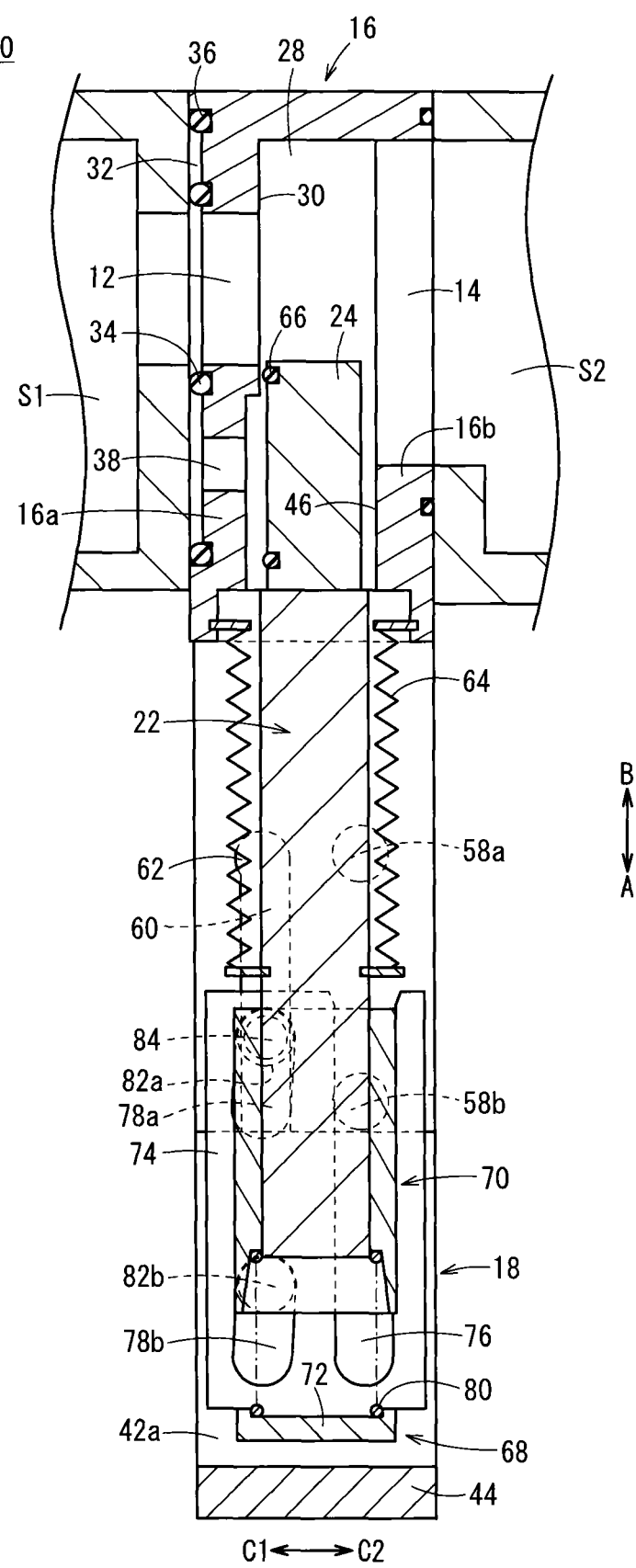
FIG. 7 is a cross-sectional view taken along line VII-VII of FIG. 6.

The gate valve 10 according to the embodiment of the present invention is constructed basically as described above. Next, operations and advantages of the gate valve 10 will be explained. In the following description, the state shown in FIG. 6, in which the two (the pair of) pistons 52 that constitute the cylinder section 20 are moved downwardly (in the direction of the arrow A), and as shown in FIGS. 6 and 7, in which the valve disk 24 is displaced downwardly in the interior of the valve box 16, thus enabling communication between the first pathway 12 and the second pathway 14 (valve open state), will be treated as an initial condition.

At first, in the initial condition, by supplying a pressure fluid to one port from a non-illustrated pressure fluid supply source, the pistons 52 are pressed and displaced upwardly (in the direction of the arrow B) by the pressure fluid that is introduced into the interiors of the cylinder tubes 50.

Accompanying displacement of the pistons 52, the yoke 68 and the displacement block 70 rise integrally, and the valve rod 22 and the valve disk 24 also rise along therewith. At this time, since the guide grooves 76 are placed in engagement with the guide rollers 58a, 58b of the cylinder section 20, the yoke 68 is guided in a vertically upward direction, and the pair of cam rollers 82a, 82b move respectively while remaining in a state of abutment with upper ends of the cam grooves 78a, 78b.

Figure 8:
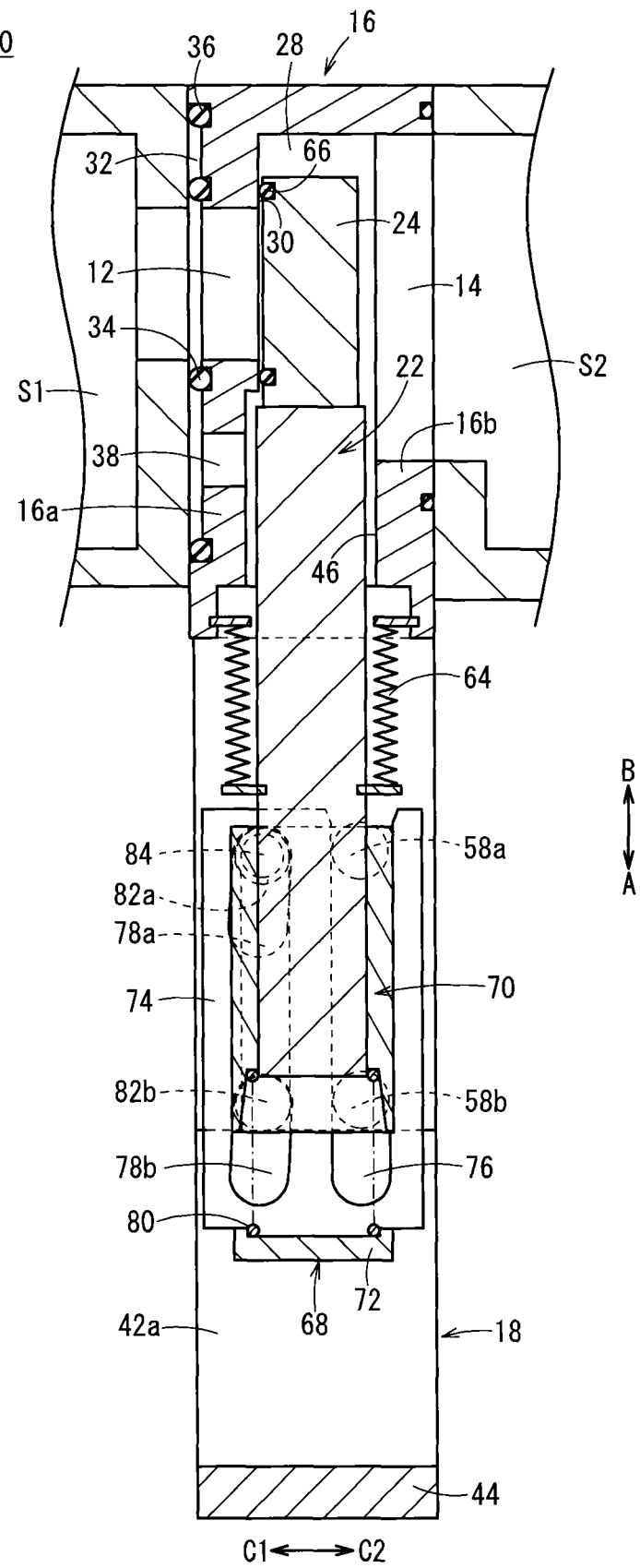
FIG. 8 is a cross-sectional view showing a state in which the valve disk is moved from the valve open state of the gate valve shown in FIG. 7 to a position at which the valve disk faces toward the valve seat.

In addition, the stopper rollers 84 of the displacement block 70 move to the upper ends of the recessed grooves 60 and arrive at their end positions, whereupon further rising movement thereof is restricted, and as shown in FIG. 8, the valve disk 24 is positioned in facing relation to the first pathway 12 and the valve seat 30 in the interior of the valve box 16. In this case, since the elastic force of the spring 80 is greater than the pressing force from the yoke 68, the spring 80 is not compressed by the yoke 68, and the yoke 68 and the displacement block 70 are displaced in unison without being displaced relatively to each other.

At this time, since the valve disk 24 is not yet seated on the valve seat 30, and a valve closed state is not yet brought about, the first pathway 12 and the second pathway 14 in the valve box 16 remain in a state of communication through a slight gap.

From the condition in FIG. 8 in which the valve disk 24 is positioned in facing relation to the valve seat 30, the pressure fluid continues to be introduced further into the cylinder tubes 50. Consequently, upon further rising of the pistons 52, the yoke 68 is pulled upwardly (in the direction of the arrow B) by the piston rods 54. At this time, since the stopper rollers 84 of the displacement block 70 are engaged by the upper ends of the recessed grooves 60 without moving, only the yoke 68 is displaced upwardly while the spring 80 is compressed. Stated otherwise, the yoke 68 is displaced relatively with respect to the displacement block 70.

In addition, accompanying the rise of the yoke 68, the stopper rollers 84 move into the horizontal groove portions 62 of the recessed grooves 60, whereby the displacement block 70 moves in a direction (the direction of the arrow C1) perpendicular to the axial line, i.e., moves horizontally, so as to approach the side of the valve seat 30, and the valve rod 22, which is held in the displacement block 70, and the valve disk 24 move integrally in a horizontal direction. Owing thereto, as shown in FIGS. 2 and 3, the valve disk 24 is seated on the valve seat 30 while pressing the sealing ring 66, and a valve closed state is brought about in which the first pathway 12 of the valve box 16 is closed.

Consequently, in the one processing chamber S1 on which the first pathway 12 is closed, a processing step can be performed on a workpiece such as a semiconductor wafer or the like.

Next, in the case of a valve open state, in which the valve disk 24 is separated from the valve seat 30, and the first pathway 12 and the second pathway 14 are again placed in communication through the accommodating room 28, under a switching operation of a non-illustrated switching means, pressure fluid is supplied from another port to the interiors of the cylinder tubes 50 of the cylinder section 20. Along therewith, the pistons 52 are lowered, and the piston rods 54 connected to the pistons 52 and the yoke 68 are lowered integrally with the pistons 52. Consequently, a condition is brought about in which the spring 80 expands, the stopper rollers 84 move away from the horizontal groove portions 62, and the cam rollers 82a, 82b abut respectively against the upper ends of the cam grooves 78a, 78b. Accompanying these actions, the valve disk 24 moves horizontally together with the valve rod 22 in a direction (the direction of the arrow C2) away from the valve seat 30, and by separating the valve disk 24 from the valve seat 30, the blocked state of the first pathway 12 is released.

In addition, by further introducing the pressure fluid into the cylinder tubes 50 and lowering the pistons 52, the yoke 68, the displacement block 70, the valve rod 22, and the valve disk 24 are lowered together with the piston rods 54, and the initial condition, namely, the valve open state, is restored by the valve disk 24 being lowered and moving away from the position facing toward the first pathway 12 in the valve box 16 (see FIGS. 6 and 7).

Consequently, a state is brought about in which the first pathway 12 and the second pathway 14 communicate with one another in the valve box 16, and the workpiece such as a non-illustrated semiconductor wafer or the like can be moved through the first pathway 12. Thus, for example, a workpiece on which a processing step has been carried out in the first processing chamber S1 is moved from the first pathway 12, through the accommodating room 28 and the second pathway 14, and into the processing chamber S2, where another processing step can be performed on the workpiece.

Further, in a valve closed state in which the workpiece has been moved into the other processing chamber S2 as described above, and the valve disk 24 is seated again on the valve seat 30, a situation may occur in which the one processing chamber S1 is kept at atmospheric pressure, whereas the other processing chamber S2 that is connected to the back surface side of the valve box 16 is held at a vacuum pressure. In this case, since the accommodating room 28 of the valve box 16 is in communication with the second processing chamber S2 through the second pathway 14, the interior of the accommodating room 28 is also held at the same vacuum pressure, and a pressure difference occurs across the valve disk 24 between the one processing chamber S1 and the accommodating room 28.

With the present invention, since the interior of the accommodating room 28 and the balance room 32 are placed in communication through the balance port 38, the vacuum pressure in the interior of the balance room 32 can be made the same as that in the accommodating room 28, or stated otherwise, the respective pressures in the balance room 32 and the accommodating room 28 can be equalized. Therefore, in the valve box 16, the pressures applied to the outer wall surface and the inner wall surface of the one side wall 16a become the same, so that even in a condition in which the accommodating room 28 of the valve box 16 is placed under a vacuum pressure, whereas the one processing chamber S1 adjacent to the one side wall 16a of the valve box 16 is kept at atmospheric pressure, loads caused by a pressure difference are not applied to the inner and outer sides of the one side wall 16a.

As a result, deformation of the one side wall 16a in the valve box 16 due to pressure differences can be prevented. Along therewith, since deformation of the valve seat 30 that is formed in the one side wall 16a is avoided, even in a valve closed state in which the valve disk 24 is seated on the valve seat 30, no gaps due to such deformation are produced between the valve disk 24 and the valve seat 30, and thus, the state of communication with the first pathway 12 can be blocked reliably and stably by the valve disk 24.

In the foregoing manner, according to the present embodiment, the balance room 32, which is recessed at a predetermined depth on the one side wall 16a of the valve box 16 facing toward the one processing chamber S1, and the balance port 38, which communicates between the balance room 32 and the accommodating room 28, are provided. Further, in such a structure, the outer side of the first pathway 12 in the balance room 32 is surrounded by the first seal member 34, and the outer edge of the balance room 32 is surrounded by the second seal member 36.

Consequently, in a valve closed state in which the valve disk 24 is seated on the valve seat 30, even if a pressure difference is developed between the accommodating room 28 and the one processing chamber S1, by enabling communication between the accommodating room 28 and the balance room 32 through the balance port 38, the pressures on the inner side and the outer side of the one side wall 16a in the valve box 16 become equalized or set at the same pressure.

As a result, without increasing the weight of the valve box 16, deformation of the one side wall 16a in the valve box 16 due to pressure differences can reliably be prevented. Further, since deformation of the valve seat 30 that is formed in the one side wall 16a does not occur, the valve disk 24, which is formed in a flat shape, can be seated on the valve seat 30 reliably and stably, and sealing of the valve disk 24 can be ensured.

Further, in the balance room 32, since communication with the first pathway 12 is blocked by the first seal member 34, thereby keeping the balance room 32 out of communication with the first pathway 12, communication between the one processing chamber S1 and the accommodating room 28 through the balance room 32, and equalizing of pressures therebetween, are prevented.

The gate valve according to the present invention is not limited to the embodiment described above, and various modified or additional structures may be adopted therein without departing from the scope of the invention as set forth in the appended claims.

What is claimed is:

1. A gate valve equipped with a valve box, a valve disk configured to be seated with respect to a valve seat formed in the valve box, a valve rod connected to the valve disk and configured to cause the valve disk to undergo linear movement as well as movements to approach and separate away from the valve seat, and a drive unit disposed in interior of a housing to which the valve box is connected, the drive unit linearly displacing the valve rod along an axial direction, wherein the valve box comprises:

an accommodating room in which the valve disk is accommodated;

a wall portion that constitutes part of the accommodating room, and including the valve seat on which the valve disk is seated;

a pathway formed in the wall portion and which provides communication between the accommodating room and a processing chamber adjacent to the valve box;

a balance room recessed at a predetermined depth into an outer wall surface of the wall portion, the balance room facing in a direction of the processing chamber; and a communication port, which provides communication between the balance room and the accommodating room, and is disposed out of communication with the pathway in interior of the balance room.

2. The gate valve according to claim 1, wherein the pathway opens in a central portion of the balance room, and a seal member is disposed between the pathway and the balance room, the pathway and the balance room being separated by the seal member.

3. The gate valve according to claim 1, wherein the pathway and the communication port are formed substantially in parallel.

4. The gate valve according to claim 3, wherein the communication port is formed with a smaller cross-sectional size than the pathway.

\* \* \* \* \*